United States Patent [19]
Yokose

[11] Patent Number: 6,140,945
[45] Date of Patent: Oct. 31, 2000

[54] CODING APPARATUS, DECODING APPARATUS, CODING-DECODING APPARATUS AND METHODS APPLIED THERETO

[75] Inventor: Taro Yokose, Nakai-machi, Japan

[73] Assignee: Fuji Xerox Co., Ltd., Tokyo, Japan

[21] Appl. No.: 09/058,355

[22] Filed: Apr. 10, 1998

[30] Foreign Application Priority Data

Apr. 18, 1997 [JP] Japan .................................. 9-101216

[51] Int. Cl.[7] .................................................. H03M 7/40
[52] U.S. Cl. .............................. 341/65; 341/51; 341/67
[58] Field of Search .................................. 341/51, 65, 67

[56] References Cited

U.S. PATENT DOCUMENTS

| | | | |
|---|---|---|---|
| 5,510,785 | 4/1996 | Segawa et al. | 341/67 |
| 5,574,449 | 11/1996 | Golin | 341/65 |
| 5,793,896 | 8/1998 | Golin | 382/246 |
| 5,970,177 | 10/1999 | Chinnock | 382/244 |

FOREIGN PATENT DOCUMENTS 63-232626 9/1988 Japan .
7-7436 1/1995 Japan .

OTHER PUBLICATIONS

"Document Data Compression algorithm Guide" Uematsu, CQ Publishing Company, pp. 46–51, Oct. 15, 1994.

*Primary Examiner*—Brian Young
*Assistant Examiner*—Jason L. W. Kost
*Attorney, Agent, or Firm*—Oliff & Berridge, PLC

[57] ABSTRACT

The present invention provides a coding apparatus, decoding apparatus, coding-decoding apparatus and corresponding methods which easily generate an adaptive Huffman code. The coding apparatus includes a frequency counting element that counts the frequency of appearance of symbols in input data and a symbol selecting element that selects the data having a frequency larger than a predetermined threshold value as dominant symbol frequency data and transfers the dominant symbol frequency data to a code assigning element. The coding apparatus further includes a fixed code word memory that stores the Huffman codes prepared in advance and transfers them to the code assigning element as fixed code word data. The code assigning element generates the Huffman codes for the dominant symbols and synthesizes the Huffman codes and the fixed code word data stored in the fixed code word memory to obtain the Huffman code as a whole. The obtained Huffman code is stored in a code word memory. Coded data may, likewise, be decoded. In other words, in a decoding apparatus according to the present invention, coded data is input and decoded using generated code words generated based on previously decoded data. Additionally, the invention provides for the coding and decoding of data with a single apparatus.

62 Claims, 17 Drawing Sheets

| SYMBOL | FREQUENCY OF APPEARANCE | BIT ASSIGNMENT | HUFFMAN CODE |
|---|---|---|---|
| "OTHERS" | – | – | – |
| – | – | – | – |
| – | – | – | – |
| – | – | – | – |

FIG. 6a

| SYMBOL | FREQUENCY OF APPEARANCE |
|---|---|

FIG. 6b

| SYMBOL | FREQUENCY OF APPEARANCE | BIT ASSIGNMENT | HUFFMAN CODE |
|---|---|---|---|
| "OTHERS" | 6 | – | – |
| a | 28 | – | – |
| e | 40 | – | – |
| s | 26 | – | – |

FIG. 6c

| SYMBOL | FREQUENCY OF APPEARANCE | BIT ASSIGNMENT | HUFFMAN CODE |
|---|---|---|---|
| "OTHERS" | 6 | 3 | 111 |
| a | 28 | 2 | 10 |
| e | 40 | 1 | 0 |
| s | 26 | 3 | 110 |

FIG. 6d

| SYMBOL | HUFFMAN CODE |
|---|---|
| "OTHERS" | 111 |
| a | 10 |
| e | 0 |
| s | 110 |

FIG. 7a

| SYMBOL | HUFFMAN CODE |
|---|---|
| a | 000 |
| b | 0010 |
| c | 0011 |
| ⋮ | ⋮ |

FIG. 7b

| SYMBOL | HUFFMAN CODE |
|---|---|
| a | 10 |
| b | 1110010 |
| c | 1110011 |
| ⋮ | ⋮ |
| e | 0 |
| ⋮ | ⋮ |
| s | 110 |
| ⋮ | ⋮ |

FIG. 7c

| | BIT ASSIGNMENT | | CODE EXAMPLE | |
|---|---|---|---|---|
| | CASE 1 | CASE 2 | CASE 1 | CASE 2 |
| SYMBOL 1 | 1 | 2 | 0 | 00 |
| SYMBOL 2 | 2 | 2 | 10 | 01 |
| SYMBOL 3 | 3 | 2 | 110 | 10 |
| SYMBOL 4 | 3 | 2 | 111 | 11 |

| PROBABILITY OF APPEARANCE OF SYMBOL 1 | PROBABILITY OF APPEARANCE OF EACH SYMBOL | | | AVERAGE CODE LENGTH | |
|---|---|---|---|---|---|
| | SYMBOL 2 | SYMBOL 3 | SYMBOL 4 | CASE 1 | CASE 2 |
| 1/3=5/15 | 2/9 | 2/9 | 2/9 | 2.11 | 2 |
| | 1/3 | 1/6 | 1/6 | 2 | 2 |
| 2/5=6/15 | 1/5 | 1/5 | 1/5 | 2 | 2 |
| | 7/20 | 1/8 | 1/8 | 1.85 | 2 |

| SYMBOL | PROBABILITY OF APPEARANCE | EXAMPLE OF HUFFMAN CODE |
|--------|---------------------------|-------------------------|
| A | 0.50 | 0 |
| B | 0.30 | 10 |
| C | 0.15 | 110 |
| D | 0.05 | 111 |

CODING APPARATUS, DECODING APPARATUS, CODING-DECODING APPARATUS AND METHODS APPLIED THERETO

BACKGROUND OF THE INVENTION

1. Field of the Invention

The present invention relates to a technique for compression of data and in particular relates to a technique for compression of data by using the Huffman code.

2. Discussion of the Related Art

Generally, for communicating or storing data, compression of data is effective to reduce the amount of stored data. Huffman coding is a typical compression technique.

The Huffman code is a publicly known technique which is described in "Document Data Compression Algorithm Guide", Uematsu, CQ Publishing Company, pp. 46–51, for example. Roughly speaking, in Huffman coding, data is compressed by assigning a short code to a symbol frequently generated and assigning a long code to a symbol rarely generated. An example of the Huffman code is shown in FIG. 13.

The following two items are conditions for rendering the Huffman code effective:

(1) the probability of appearance of each symbol is already known; and (2) the probability of appearance of each symbol is stationary. Condition (1) originates in that the generation of the Huffman code depends on the probability of appearance of each symbol, and condition (2) originates in that the Huffman coding uses a fixed code table. However, it is necessary to perform a statistical process on the input data before coding to satisfy condition (1) and therefore, the processing load is increased. Condition (2) in general, cannot be satisfied by general input data.

In order to achieve the above conditions, a method of updating the Huffman code at appropriate intervals is known. In this method, condition (1) is unnecessary because the code is designed based on the statistics of the data coded immediately before it. Condition (2) is achieved if the probability of appearance of each symbol varies slightly because the optimum code is used in every updating step. Such a method is discussed in Japanese Patent Application Laid-Open No. Hei. 7-7436 (1995).

FIGS. 15 and 17 are block diagrams illustrating a coding apparatus and a decoding apparatus of the prior art. First, the coding apparatus of the prior art is described with reference to FIG. 15.

In the apparatus of FIG. 15, the input data 100 to be coded is input through the data inputting element 10 and transferred to the frequency counting element 20 and a data memory 90. The frequency counting element 20 counts the frequency of appearance of symbols contained in the input data 100 and transfers the counted value to a code assigning element 40 as frequency data 110. The code assigning element 40 generates code word data 141 based on the frequency data 110 and stores it in a code word memory 60. A Huffman coding element 70 performs the Huffman coding on the input data 100 by using the code word data 141 stored in the code word memory 60 and transfers a coding result to a code outputting element 80 as code data 151. The code outputting element 80 outputs the generated code data 151.

Next the decoding apparatus of the prior art is discussed with reference to FIG. 17. Elements corresponding to elements in FIG. 15 have the same reference numbers as those in FIG. 15 and therefore, their explanations are omitted.

The code data 151 to be decoded is input through a code inputting element 15 and transferred to a Huffman decoding element 75. The Huffman decoding element 75 performs the Huffman decoding for the code data 151 input through the code inputting element 15 by using the code word data 141 stored in the code word memory 60 and transfers a decoding result to a data outputting element 85 as the input data 100. The data outputting element 85 outputs the generated input data 100.

The operation of the prior art apparatuses are now described based on the above construction. FIGS. 16 and 18 are flow charts illustrating a coding operation and a decoding operation of the prior art.

First, the coding process is described with reference to FIG. 16. In step 10, the frequency counting element 20 counts the symbols of each type contained in the input data 100 to obtain the frequency data 110. In step 211, it is determined whether the frequency data 110 satisfies a predetermined condition for the process of updating the code table at that time. If the frequency data 110 satisfies the condition, the process proceeds to step 212. Otherwise, the process proceeds to step 30. In step 212, the code assigning element 40 generates the Huffman code based on the frequency data 110 to obtain the code word data 141 and proceeds to step 30. In step 30, the Huffman coding element 70 performs the Huffman coding for the input data 100 by using the code word data 141 and goes to step 40. In step 40, it is determined whether there is any unprocessed input data 100. If there is, the process returns to step 10. Otherwise, the coding process is completed and ends.

The decoding process is now explained with reference to FIG. 18. Processes corresponding to processes in FIG. 16 have the same step numbers as those in FIG. 16 and their explanations are therefore omitted. In step 50, the Huffman decoding element 75 performs the Huffman decoding for the code data 151 by using the code word data 141.

In the above operation, the same initial value is given to the codes used in the coding and decoding processes. General purpose code or the code specially designed code may be used as input data. In the latter case, it is necessary to identify the code table to the decoding side by assigning the code table to the header of the code data.

The condition for updating the code table in step 212 can be arbitrarily determined. For example, in Japanese Patent Application Laid-Open No. Hei. 7-7436, the conditions are particularly applied to motion pictures and the code table is updated for every frame.

An algorithm for generating the Huffman code in step 213 is not described in detail here because it is publicly known and described in, for example, "Document Data Compression Algorithm Guide", Uematsu, CQ Publishing Company. Generally, in a Huffman code generating algorithm, symbols are sorted in the order of the probability of appearance. Two symbols having low probabilities are combined to generate a new symbol. This process is repeated and codes are assigned to the symbols.

In the prior art, it is desirable that the update of the code table be performed for every unit in which the distribution of the probabilities of appearance of the input symbols is constant. Therefore, the interval of updating should be as short as possible if sufficient statistical materials are available for presuming the distribution of probability of appearance of each symbol. Unlike the description in Japanese Patent Application Laid-Open No. Hei. 7-7436, if the conditions are applied to still pictures, similarity in distribution of probabilities of appearance of each symbol among images cannot be expected. Therefore, the update of the code table in a frame is effective.

The sorting process is frequently used in the process of generating the Huffman code in step 213. For this reason, if the interval of the update of the code table is shortened, the burden to the whole process is increased.

To overcome the above problem, a method described in Japanese Patent Application Laid-Open No. Sho. 63-232626 (1988) has been devised. In the application, symbols are rearranged in the order of frequency of appearance and written to the code table prepared in advance to generate the Huffman code with fewer processes. According to this method, the burden of generating the Huffman code can be reduced because the sorting process is required only one time.

The problem with this method is that there is no assurance of efficient reduction of the amount of code. That is, there is no assurance that an optimum code is generated because many patterns of distribution of probability of appearance are possible even though the symbols are sorted in the order of frequency of appearance.

SUMMARY OF THE INVENTION

In view of the above problems, the present invention has as an object, to provide a coding method for easily generating an adaptive compressed code such as the Huffman code.

To achieve the object in accordance with the purpose of the invention, as embodied and broadly described herein, a coding apparatus according to the first aspect of the present invention, includes a data inputting element for inputting data to be coded, a frequency counting element for counting a frequency of appearance of each symbol in the data input through the inputting element and a symbol selecting element for selecting dominant symbols from a set of symbols based on the frequency of appearance counted by the frequency counting element. The coding apparatus further includes a fixed code word storing element for storing each code word designed in advance according to an expected probability of appearance of each of the symbols, a code assigning element for generating a new code word for each dominant symbol and assigning a combined code word that is a combination of a code word indicating a non-dominant symbol and the code word stored in the fixed code word storing element to each of the non-dominant symbols, a code word storing element for storing the code words generated or assigned by the code assigning element, a coding element for coding the data input through the data inputting element based on the code words stored in the code word storing element, and a code outputting element for outputting coded data generated by the coding element.

A decoding apparatus according to a second aspect of the present invention includes a code inputting element for inputting coded data, a code word storing element for storing code words, a decoding element for decoding the coded data input through the code inputting element based on the code words stored in the code word storing element, a frequency counting element for counting a frequency of appearance of each symbol in data generated by decoding and a symbol selecting element for selecting dominant symbols from a set of the symbols according to the frequencies of appearance counted by the frequency counting element. The decoding apparatus further includes a fixed code word storing element for storing each code word designed in advance according to an expected probability of appearance of each of the symbols, a code assigning element for generating a new code word for each dominant symbol and assigning a combined code word that is a combination of a code word indicating a non-dominant symbol and the code word stored in the fixed code word storing element to each of the non-dominant symbols, and a data outputting element for storing the code words generated or assigned by the code assigning element in the code word storing element and outputting data generated by the decoding element.

According to a third aspect of the present invention, a combination of the above coding apparatus and decoding apparatus provides a coding-decoding apparatus.

With any of the above constructions, the amount of coding is reduced because the code word is adaptively updated for the dominant symbol which specially affects the average code word length. Moreover, a load of updates of the code word can be reduced. Also, in the symbol selecting element, symbols having frequencies larger than a predetermined threshold value may be selected as the dominant symbols based on the result of the count of the frequencies by the frequency counting element. Additionally, symbols having higher ranks than a predetermined rank value are selected from the symbols, sorted in descending order of the frequency of appearance, by the symbol selecting element as the dominant symbols based on the result of the count of the frequency by the frequency counting element.

Further, symbols are sorted in descending order of the frequency of appearance and symbols having values of accumulated frequencies of preceding symbols smaller than a predetermined threshold value are selected as the dominant symbols from the sorted symbols by the symbol selecting element. This selection is based on the result of the count of the frequency by the frequency counting element.

The Huffman coding method may be used as the method by which the code assigning element assigns codes to the dominant symbols. In the code assigning element, if there is an extra fixed code word which should have been assigned to the dominant symbol and there is any non-dominant symbol with its length longer than that of the fixed code word, the fixed code word can be temporarily assigned to the non-dominant symbol. It is also possible that the code word is generated if the frequency of appearance of each symbol is out of the range of a predetermined value. It is further possible to activate the code assigning element if coding or decoding of a predetermined number of symbols is completed.

If it is expected that an average length of the code words generated by the code assigning element is longer than the average length of the fixed code words stored in the fixed code word storing element, the fixed code words may be used as the new code words.

A counted value can be initialized in the frequency counting element by multiplying the counted value at that time by a positive number not more than 1.

The code words to be stored in the fixed code word storing element can be replaced with new code words generated based on the statistics of the processed data.

In the code assigning element, the code word can be easily generated by preparing plural patterns of the probability of appearance of the symbol and plural code words respectively corresponding thereto in advance and classifying the dominant symbol into one of the plural patterns of the probability of appearance. The dominant symbol may be classified into the pattern of the probability of appearance by comparing the probability of appearance of the symbol appearing most frequently with a threshold value. The dominant symbol may also be classified into the pattern of probability of appearance according to a result of an operation using frequencies of some of the dominant symbols sorted in orders of frequency which correspond to plural predetermined orders.

In the code word storing element, a constant can be set for a code word as an initial value. It is also possible to use the fixed code word stored in the fixed code word storing element as an initial value.

According to a fourth aspect of the present invention, coding is performed by a method having the steps of inputting data containing plural symbols, counting a frequency of appearance of each symbol in the input data, selecting a dominant symbol from the symbols based on the counted frequency of appearance, generating a code word for the selected dominant symbol, generating a predetermined code word for a non-dominant symbol according to an expected probability of appearance, and coding the input data by using the generated code word.

According to a fifth aspect of the present invention, decoding is performed by a method having the steps of inputting coded data and decoding the coded data using generated code words. The code words are generated by counting a frequency of appearance of each of the symbols in previously decoded data, selecting a dominant symbol from the symbols based on the counted frequencies of appearance, generating a code word for the dominant symbol, and generating a code word according to a predicted probability of appearance for a non-dominant symbol.

With the constructions of the fourth and fifth aspects, the coding amount can also be reduced because the code word is adaptively updated for the dominant symbol which directly affects the average code word length. Moreover, the load of updates of the code word can also be reduced.

Additional objects and advantages of the invention will be set forth in part in the description which follows and in part will be obvious from the description, or may be learned by practice of the invention.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings:

FIGS. 6(a) through 6(d) show examples of internal formats of a list of dominant symbols in the first embodiment of the coding apparatus according to the present invention;

FIGS. 7(a) through 7(c) show examples of codes generated in the first embodiment of the coding apparatus according to the present invention;

DETAILED DESCRIPTION OF THE PREFERRED EMBODIMENTS

Figure 1:
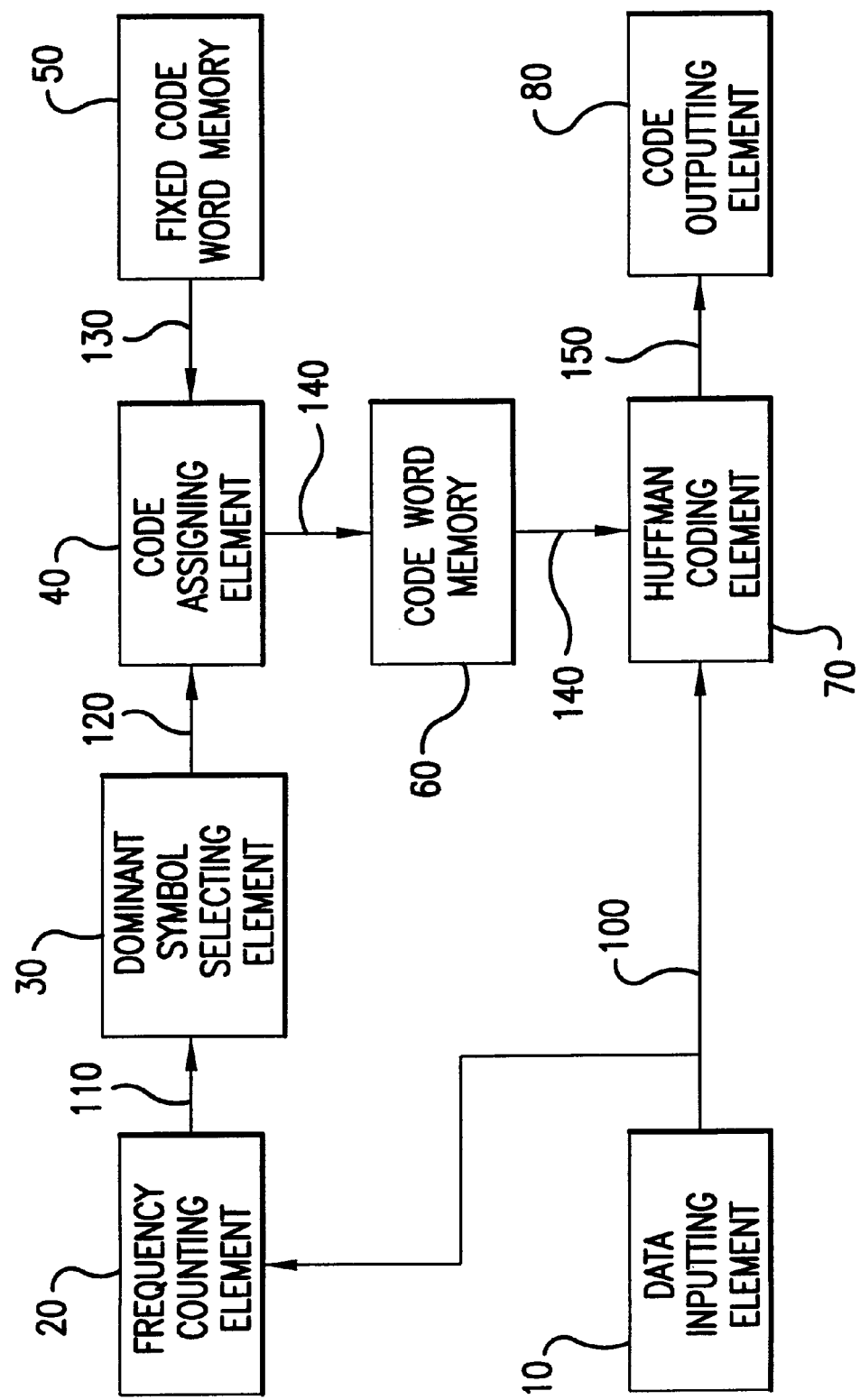
FIG. 1 shows the construction of the first embodiment of a coding apparatus according to the present invention.

The conventional Huffman coding-decoding apparatus has a problem in that there is a heavy burden to the process of generating the Huffman code and difficulty in reducing the time between the updating intervals of the code table. To overcome these problems, in the present invention, the normal Huffman codes are generated for symbols of high frequency of appearance, which seem to have great influence on the average code length. On the other hand, general purpose codes prepared in advance are given to the other symbols. Hereinafter, the symbol of high frequency of appearance is referred to as a dominant symbol.

More specifically, the average code length of the Huffman code is represented by the sum of products of the code length l(s) and probability of appearance p(s) given to each symbol s. That is, the average code length of the Huffman code is represented by the following expression:

$$(\text{average code length}) = \sum_{s}^{s \in S} l(s) \times p(s) \quad (1)$$

wherein S represents a set of all symbols.

As an example, it is assumed that there are six symbols from s0 through s5, and probabilities of appearance of s0 and s1 are ½ and ¼, respectively. Probabilities of appearance of other symbols are less than ¼. On this assumption, the theoretical average code length has a minimum value in the case where, for example, the probability of appearance of s2 is almost, but does not reach, ¼ and probabilities of appearance of other symbols are approximately 0. If the normal Huffman code is generated under this condition, codes of lengths 1, 2 and 3 bits are assigned to s0, s1 and s2, respectively. Consequently, the average code length is calculated according to expression (1) as follows:

$$\text{(average code length of the Huffman code)} = 1 \times \tfrac{1}{2} + 2 \times \tfrac{1}{4} + 3 \times \tfrac{1}{4} = 1.75 \text{(bits)} \qquad (2)$$

In the present invention, it is assumed, for example, that the symbols having probabilities of appearance of ¼ or more are regarded as the dominant symbols. In this case, codes of the lengths of 1 and 2 bits are assigned to s0 and s1, respectively. Each of the other symbols is represented by a 2-bit code indicating non-dominant symbol and by another 2-bit code indicating any of the symbols from s2 to s5. The average code length in this case is calculated according to expression (1) as follows:

$$\text{(average code length in the present invention)} = 1 \times \tfrac{1}{2} + 2 \times \tfrac{1}{4} + 4 \times \tfrac{1}{4} = 2.0 \text{(bits)} \qquad (3).$$

Since the average code length in this case is $\log_2 6 = 2.6$ (bits), the value of (3) is sufficiently small though it is inferior to the value of (2). The above estimation is the result of calculation with severe conditions imposed to the present invention and, in fact, it seems to be hardly possible for the probability of appearance of s2 to be extremely higher than those of s3, s3 and s5. Therefore, actual difference between the values of (2) and (3) may be smaller.

First Embodiment

Figure 4:
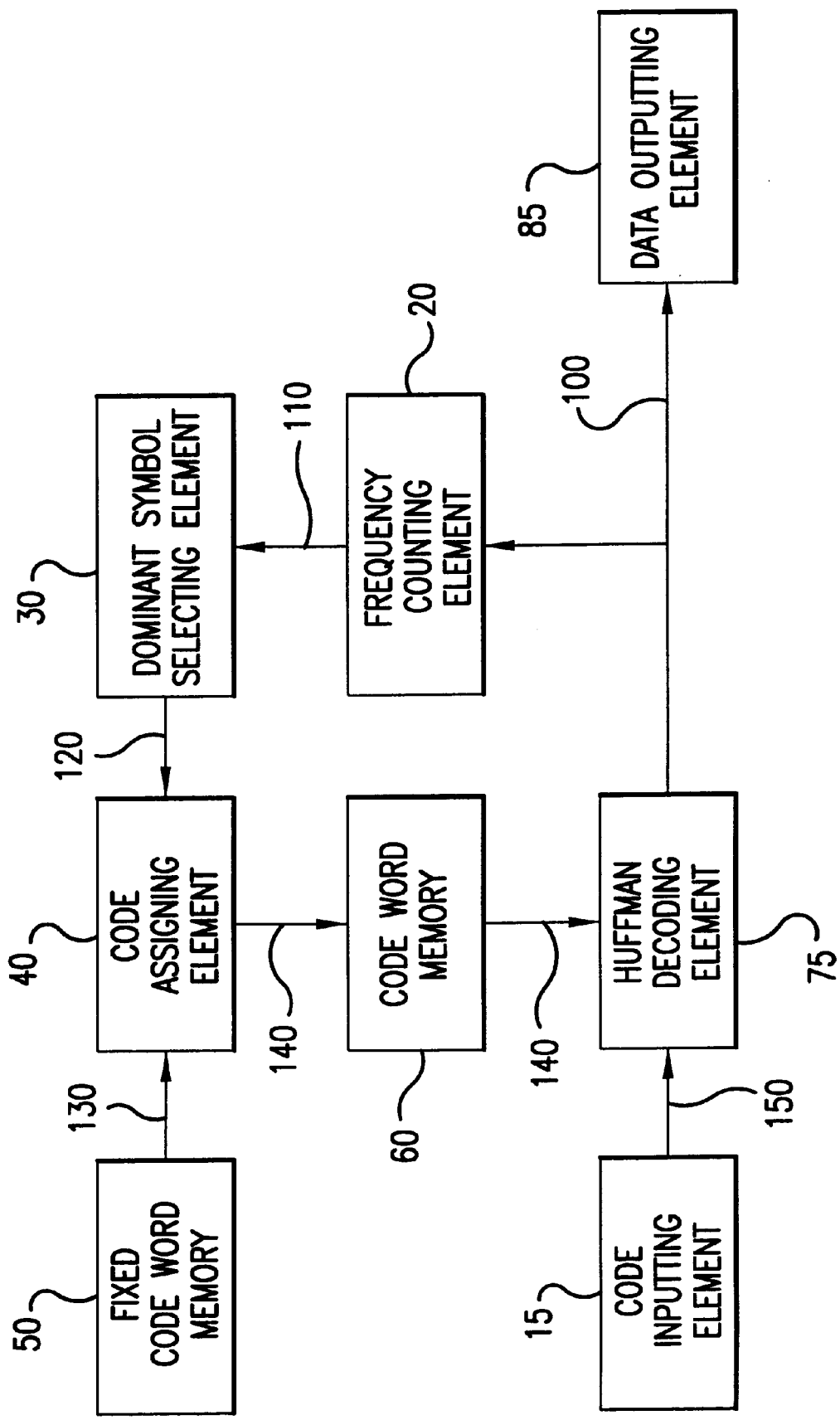
FIG. 4 shows the construction of the first embodiment of a decoding apparatus according to the present invention.

FIGS. 1 and 4 are block diagrams showing the constructions of the first embodiment of a coding apparatus and a decoding apparatus, respectively. Corresponding elements in FIGS. 1, 4, 15 and 17 have the same reference numbers and their explanations are omitted.

As shown in FIG. 1, a dominant symbol selecting element 30 selects only the data having a frequency larger than a predetermined threshold value from the frequency data 110 and transfers the data to the code assigning element 40 as dominant symbol frequency data 120. A fixed code word memory 50 stores the Huffman code generated in advance for a predicted distribution of probability of appearance of the input data 100 and transfers it to the code assigning element 40 as fixed code word data 130.

FIG. 4 shows the construction of the decoding apparatus. Elements in FIG. 4 are the same as those of the prior art or the coding apparatus described above, therefore no explanation is repeated here.

Figure 2:
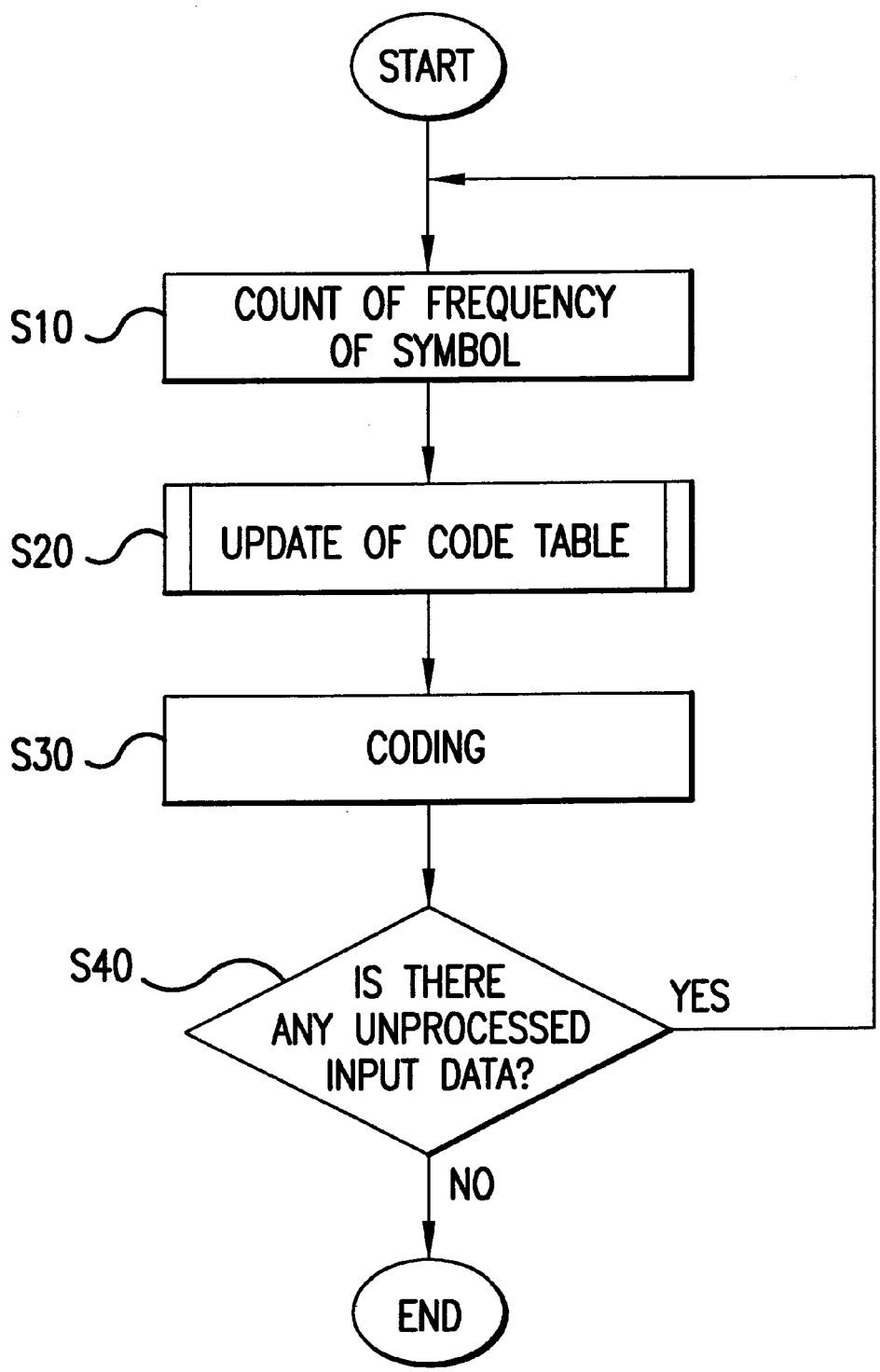
FIG. 2 is a flow chart showing an example of a coding operation in the first embodiment of the coding apparatus according to the present invention.
Figure 3:
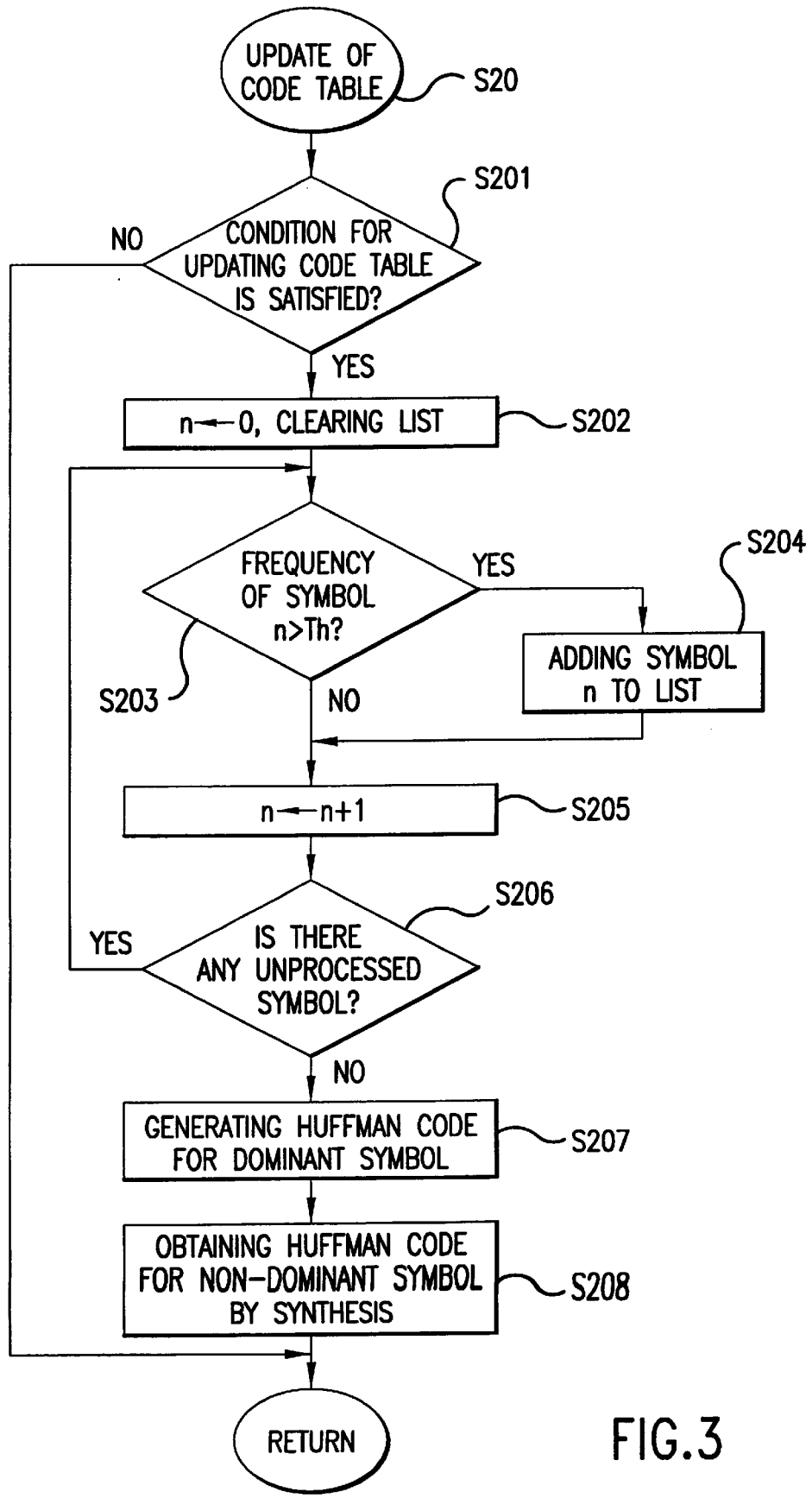
FIG. 3 is a flow chart showing an example of an operation process of updating a code table in the first embodiment of the coding apparatus according to the present invention.
Figure 5:
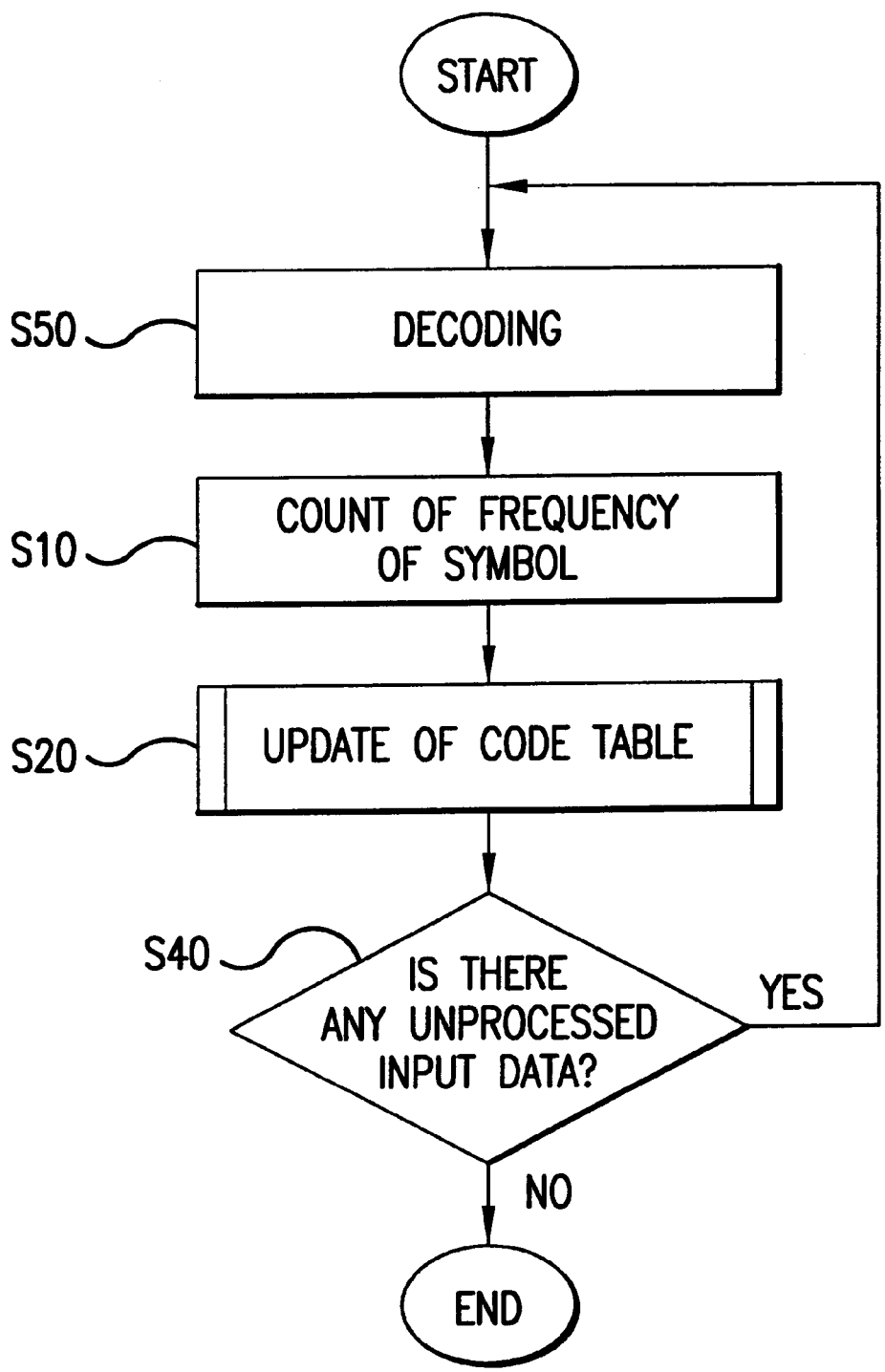
FIG. 5 is a flow chart showing an example of a decoding operation in the first embodiment of the decoding apparatus according to the present invention.

FIGS. 2 and 3 are flow charts showing the operation in the coding process in this embodiment and FIG. 5 is a flow chart showing the operation in the decoding process in this embodiment. Since some of the steps in FIG. 2 are the same as those of the prior art, they have the same reference numbers as those of the prior art and their explanations are omitted.

Now updating of the code table in step 20 will be described with reference to FIG. 3. In step 201, it is determined whether a condition for updating the code table is satisfied or not. If it is satisfied, the process proceeds to step 202. Otherwise, the process proceeds to step 30 in FIG. 2.

In step 202, a variable n indicating an identifier of a symbol and a list of dominant symbols storing the dominant symbol frequency data 120 are initialized. The process then proceeds to step 203, where the frequency data of the symbol indicated by n is fetched from the frequency data 110 and compared with a predetermined threshold value Th. If the fetched frequency data is larger than Th, the process proceeds to step 204. Otherwise, the process proceeds to step 205.

In step 204, the frequency data compared with Th in step 203 is added to the list of dominant symbols in the code assigning element 40. In step 205, the variable n is incremented and the process goes to step 206. In step 206, it is determined whether there is any unprocessed symbol or not. If there is, the process proceeds to step 203. Otherwise, the process proceeds to step 207.

In step 207, the Huffman codes are generated for the dominant symbols in the list of dominant symbols in the code assigning element 40. Then, in step 208, the code assigning element 40 obtains the Huffman code for all symbols by synthesizing the Huffman codes generated in step 207 and the fixed code word data 130 stored in the fixed code word memory 50.

FIG. 5 shows the operation of the decoding process in this embodiment. The operation of the decoding process in FIG. 5 is similar to the prior art with the exception of step 20. Step 20 in FIG. 5 is the same as that of the operation of the coding process of this embodiment. Therefore the explanation of the specific steps in FIG. 5 is omitted.

In the aforementioned operations, the code word stored in the fixed code word memory 50 is used for the first coding and decoding, for example. Alternatively, another initial value may be written to the code word memory 60.

Next, the process performed in the code assigning element 40 will be described in detail. Hereinafter, it is assumed that the symbols are represented by 26 small-letter alphabets for simplifying the explanation.

For assigning a code to a symbol not selected to be entered into the list of dominant symbols in the code assigning element 40, a symbol "others" is registered during initialization. An example of an internal format of the list of dominant symbols is shown in FIG. 6(a). If the threshold value Th used in step 203 is determined to be ¼ symbols of the whole, for example, the maximum number of the dominant symbols is 3 because the symbol having the frequency equal to Th is not selected. Provided that the condition of updating the code table is completion of coding of 100 symbols, FIGS. 6(b) and 6(c) show an example of the format of the dominant symbol frequency data 120 and an example of the list of dominant symbols immediately before proceeding to step 207 after the process of selection is completed for all symbols, respectively.

At this time, it is assumed that the frequency of appearance of "others" is obtained by subtracting the frequencies of the dominant symbols from the frequency of the whole. It may also be possible to obtain the probability of appearance of "others" by accumulating frequencies of symbols not selected immediately after step 203.

FIG. 6(d) shows an example of performing the Huffman coding in step 207 for symbols selected in FIG. 6(c). Thus the codes corresponding to 3 dominant symbols "a", "e" and "s" are generated.

For other symbols, the code "others" and the fixed code word prepared in the fixed code word memory 50 as a default are synthesized and assigned. An example of the fixed code words is shown in FIG. 7(b). The code table is generated by estimating the probabilities of appearance of symbols in advance of starting the process of coding. The codes generated in step 207 are shown in FIG. 7(a). The codes synthesized with the fixed code words, namely, the final codes, are shown in FIG. 7(c). In this case, the code assigned to the dominant symbol by the fixed code word, such as "111000" indicating the symbol "a" in the example in FIGS. 7(a) through 7(c) is rendered futile, but it is ignored because there is little influence on the average code length. However, to simplify matters, it may be possible to replace the symbol of the fixed code word with that having a longer code length. In the example of FIGS. 7(a) through 7(c), "111000" is not used. Therefore, it is allowed to temporarily exchange "a" and "b" in FIG. 7(b) by assuming "111000" to be the code of "b".

If there is no dominant symbol except "others" when the process reaches step 207, the fixed code word is used as the code word data 140. In some cases though, there are two or more dominant symbols including "others". In these cases, the average code length becomes shorter if the fixed code word is used. To avoid this situation, the following additional process should be performed.

To simplify the explanation, it is assumed that there are two dominant symbols including "others". As to the cases where more dominant symbols exist, analogy with this case is easily available from the following explanation. At first, it is assumed that the average code length is $l_{th}$ when an ideal distribution of probability of the fixed code word occurs. It is further assumed that this is the theoretical average code length of the fixed code word. In other words, $l_{th}$ is represented by the following equation (4):

$$l_{th} = \sum_i l_{fix}(i) \times p_{th}(i) \quad (4)$$

wherein it is assumed that the predicted probability of appearance of the symbol "a" is $p_{th}(a)$, the assigned code length is $l_{fix}(a)$, and the sum total is calculated for all symbols having possibility of appearance. Next, it is assumed that the dominant symbols are "others" and "x", and the codes "1" and "0" are assigned thereto, respectively, in step 207. The average code length $l_{sel}$ is approximately calculated by the following equation (5):

$$l_{sel} = 1 \times p(x) + (1 + l_{th}') \times (1 - p(x)) = 1 + l_{th}' \times (1 - p(x)) \quad (5)$$

wherein p(a) is a probability of appearance of the symbol "a" calculated by actually counting the frequency of appearance of "a" and $l_{th}'$ is the theoretical average code length in the case where "x" is left out of the fixed code word. $l_{th}'$ is approximated by equation (6) as follows:

$$l_{th}' = \sum_i^{i \neq x} l_{fix}(i) \times p_{th}(i) / (1 - p_{th}(x)) \quad (6)$$
$$= (l_{th} - l_{fix}(x) \times p_{th}(x)) / (1 - p_{th}(x))$$

wherein the sum total is calculated for all symbols having possibility of appearance except "x". The average code length $l_{fix}$ in the case where the fixed code word is used even though "x" is selected for equation (5) is represented as follows:

$$l_{fix} = l_{fix}(x) \times p(x) + l_{th}' \times (1 - p(x)) \quad (7).$$

Equation (7) is subtracted from equation (5) as follows:

$$l_{sel} - l_{fix} = 1 - l_{fix}(x) \times p(x) \quad (8).$$

Consequently, if the value of equation (8) is plus, the fixed code word should be used. In contrast, if the value of equation (8) is minus, a newly synthesized code word is used.

Figure 8:
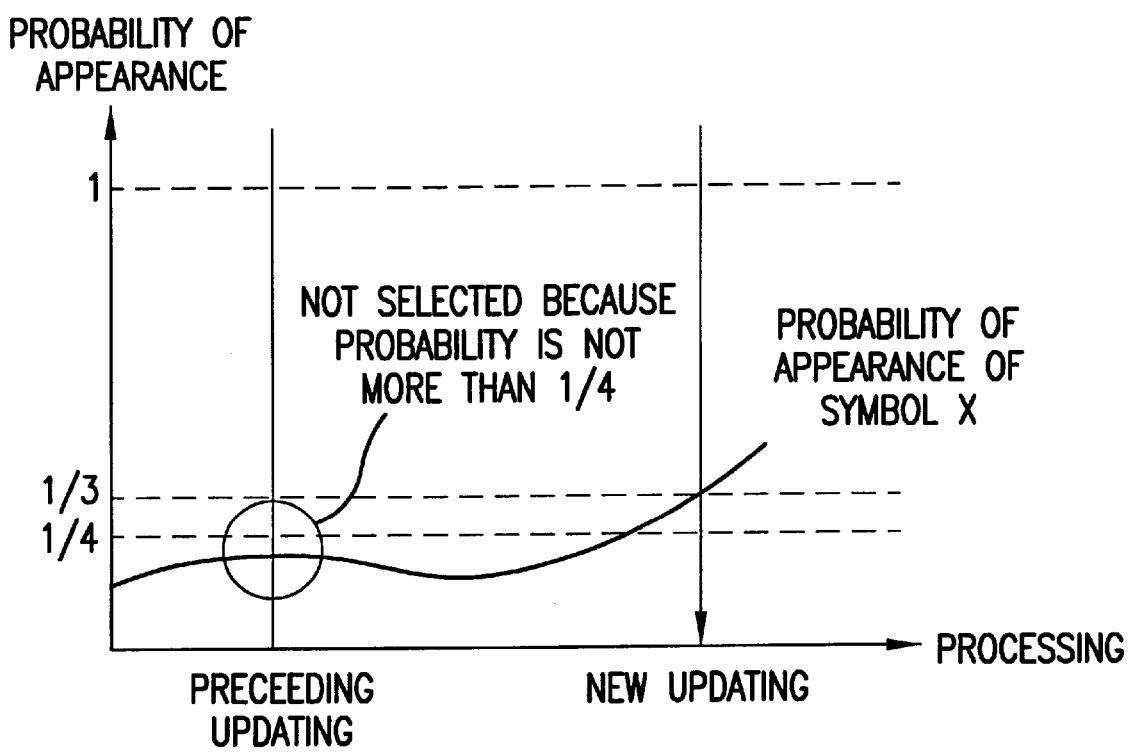
FIG. 8 shows an example of a condition for updating the code table in the first embodiment of the coding apparatus according to the present invention.

In the above operation, the condition for updating the code table can be arbitrarily determined. For example, the condition may depend on the amount of data to be processed, as in the above-described example, or the condition may vary according to the degree of change of the probability distribution. For instance, the frequency of appearance of symbols is observed. If the frequency of appearance of a symbol other than the dominant symbol (in the above example, the symbol whose probability of appearance is not more than ¼) successively occurs exceeding some specific probability of appearance (for example, ⅓), it is determined that the distribution of probability has changed. This example is shown in FIG. 8. In contrast, it may also be possible to supervise reduction of probability of appearance of the dominant symbol.

In the above example, the dominant symbols are selected based on the result of the threshold process for the frequency of appearance, but they can also be determined by other methods. The dominant symbols may be determined according to frequencies of appearance. For instance, the threshold process can be performed by ranking the symbols in the order of frequency of appearance. That is, the symbols in higher ranks than the predetermined order value may be determined to be the dominant symbols. Thus the number of dominant symbols can be kept constant.

The symbols can also be sorted in the order of frequency with the frequencies of symbols being accumulated in descending order. The threshold process may then be performed for the accumulated values. That is, the symbols having accumulated values of frequencies smaller than a predetermined value are determined to be the dominant symbols.

For example, if the accumulated value of frequencies of symbols from the first symbol through the fifth symbol is smaller than a predetermined value, and the accumulated value of those from the first symbol through the sixth symbol exceeds the threshold value, the symbols from the first symbol through the fifth symbol are determined to be the dominant symbols. According to such methods, influence caused by the dominant symbols can be qualitatively stabilized. In other words, all frequencies of the dominant symbols are the same predetermined value. Therefore, the influence of the dominant symbols is stabilized.

The count of the frequency of appearance in the frequency counting element 20 is initialized with 0. Moreover, the frequency may be offset in initialization corresponding to the processed data. For example, initialization such as represented by the following equation (9) is possible:

$$count_i = count_{i-1} \times a (0 < a \leq 1) \quad (9)$$

wherein $count_i$ is the initial value and $count_{i-1}$ is the frequency of appearance immediately before. Therefore, pieces of frequency data can be leveled and the codes with the broader aspects, not affected by local variation of the distribution of probability, can be generated.

The Huffman codes stored in the fixed code word memory 50 can be used or an appropriate initial value can be given in a specification as the code of the initial value used before the first update of the code table.

If the Huffman code to be stored in the fixed code word memory 50 is changed at a proper timing, the code amount can be reduced. That is, the probability of appearance predicted in advance based on the statistical value of the processed data is modified and the Huffman code is newly generated.

The above embodiment was explained with reference to the Huffman code, however, other codes are also applicable as long as they can be adaptively designed. For example, codes having lengths based on an integral number, such as Shannon-Fano code, are applicable. Arithmetic code is also applicable by replacing the code word with the division of augend.

Second Embodiment

The second embodiment provides an example process of generating the Huffman code for the dominant symbol which allows the present invention to simplify the Huffman code generating process. The principle of the second embodiment is that the bit assignment is classified into several patterns and the codes corresponding thereto are prepared in advance. These codes are prepared by utilizing the fact that the probability of appearance of the symbol to be selected is larger than a specific threshold value. The classification of the bit assignment into several patterns is approximately performed according to a very simple process.

The construction and operation of the second embodiment are similar to those of the first embodiment. Therefore, the explanation of similar elements and steps are omitted. The second embodiment is a modification of the process of step 207 shown in FIG. 3 of the first embodiment. Hereinafter, for simplification, it is predicted that the threshold value is ⅛ of the total number of frequencies of symbols and the probability of appearance of "others" is larger than ⅛. However, other cases can be easily analogized to this example embodiment.

It is assumed that four dominant symbols including "others" are sorted in the order of frequency of appearance and referred to as symbol 1, symbol 2, symbol 3 and symbol 4. (The process for the case where the number of dominant symbols is three or less is basically the same as the case of four dominant symbols, and is very simple. Therefore, its explanation is omitted.) The probability of appearance of symbol n is represented as p(n). Accordingly, the following inequality is established.

$$p(1) \geq p(2) \geq p(3) \geq p(4) \tag{10}$$

Figures 9A, 9B, 9C, 9D:
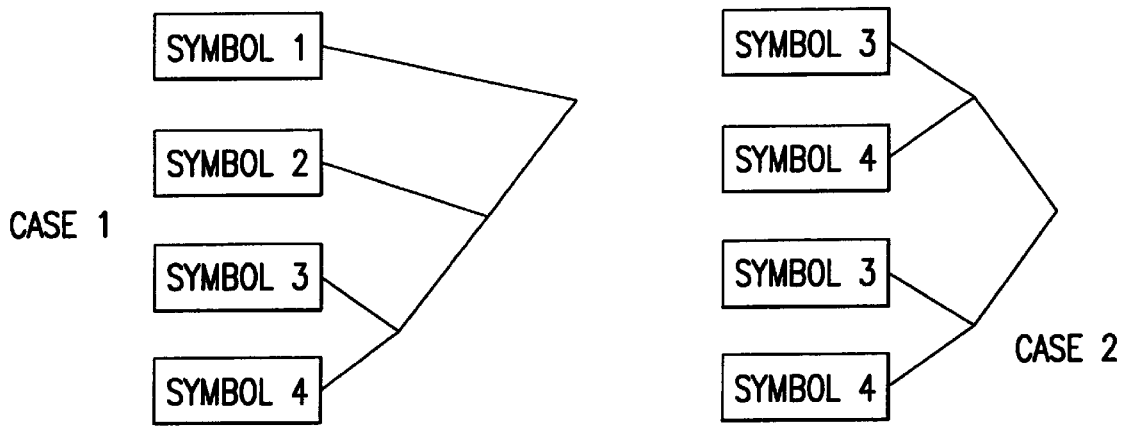
FIGS. 9(a) through 9(d) show examples of codes generated in the second embodiment of a coding-decoding apparatus according to the present invention.

Here, two patterns of bit assignment shown in FIG. 9(*a*) are possible and code trees corresponding thereto are shown in FIGS. 9(*b*) and 9(*c*). The average code lengths of both code trees are represented as follows:

$$l_{case1} = p(1) + 2 \cdot p(2) + 3 \cdot (p(3) + p(4))$$

$$l_{case2} = 2 \cdot (p(1) + p(2) + p(3) + p(4)) \tag{11}$$

The condition for establishing $l_{case1} = l_{case2}$ is as follows:

$$p(1) = p(3) + p(4) \tag{12}$$

Since the sum total of p(n) is 1, the following expression can be obtained:

$$2 \cdot p(1) + p(2) = 2 \cdot (p(3) + p(4)) + p(2) = 1 \tag{13}$$

Taking the condition of inequality (10) into consideration, the range of p(1) which establishes $l_{case1} = l_{case2}$ is as follows.

$$\tfrac{1}{3} \leq p(1) \leq \tfrac{2}{5}$$

The upper and lower limits of the average code length when p(1) has extreme values within the range, namely ⅓ and ⅖, are shown in FIG. 9(*d*). For example, if p(1) is ⅓, p(2) should be within the range of ⅖≦p(2)≦⅓, and thereby the values of p(3) and p(4) are limited. As a result, the average code length of case1 ranges from 2 to 2.11. From FIG. 9(*d*), it turns out that the bit assignment of case1 in FIG. 9(*a*) is always optimum when p(1) exceeds ⅖. In contrast, when p(1) is less than ⅓, the bit assignment of case2 always becomes optimum. In the case of ⅓<p(1)<⅖, the optimum bit assignment cannot be specified. However, because an error in determination of the optimum bit assignment causes little difference in the amount of code, it can be ignored.

Figure 10:
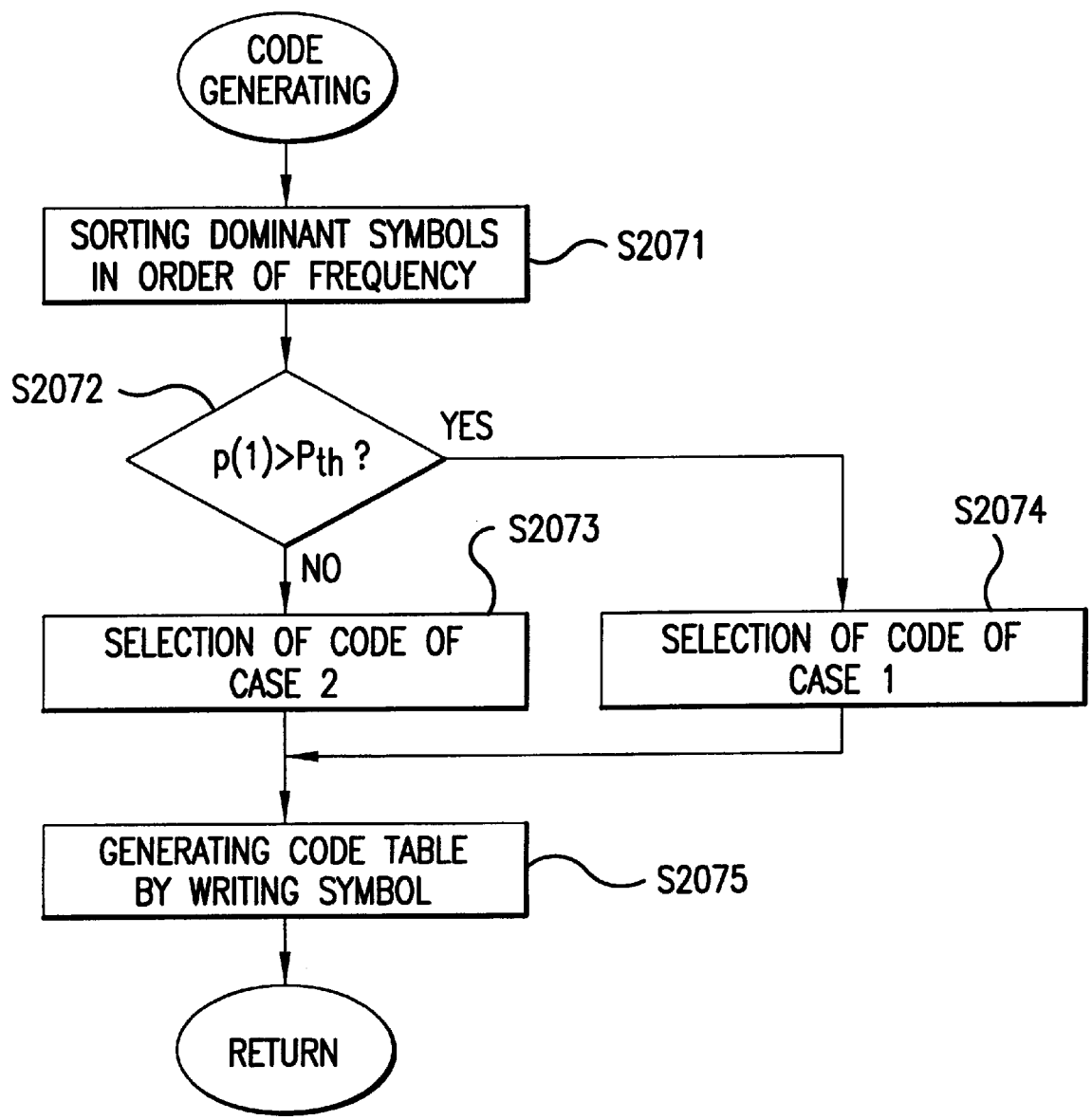
FIG. 10 is a flow chart showing an example of partial operation of updating the code table in the second embodiment of the coding-decoding apparatus according to the present invention.

FIG. 10 is a flow chart showing the operation in the second embodiment. In step 2071, the dominant symbols are sorted in the order of frequency. Then, in step 2072, it is determined whether the maximum value p(1) of the probability of appearance is larger than the threshold value $p_{th}$ or not. If p(1) is larger than $p_{th}$, the process proceeds to step 2074. Otherwise, the process proceeds to step 2073.

In step 2073, the code of case2 in FIG. 9(*a*) is selected. Then, in step 2074, the code of case1 is selected.

In step 2075, a code table for associating the dominant symbols and codes obtained in step 2073 or 2074 is generated.

In the above example operation, the value of $p_{th}$ is appropriately selected from within the range of ⅓<p(1)<⅖. For example, a medium value of ¹¹⁄₃₀, ⅓, or the like, that makes determination easy, is adopted. If ease of determination is thought to be more important than an increase in the amount of code, the value of $p_{th}$ may be the reciprocal of a power of 2 that makes evaluation easier, i.e., ¼, ½ or the like.

If the optimum code is determinable, $l_{case1} - l_{case2} = p(1) - p(3) - p(4)$ may be calculated to confirm whether the optimum result is plus or minus. In this case, the burden is somewhat increased, but the code becomes optimum without fail.

As another example, the case where the number of dominant symbols including "others" is 5 will be described. In this case, possible patterns of bit assignment are indicated in a form of arrangement in the order of frequency of appearance as 12344, 13333 and 22233. However, based on the fact that the probability of appearance of each symbol is larger than ⅛ and the rule of generation of the Huffman code, it is found that the bit assignment 12344 does not exist. Consequently, there are actually two patterns shown in FIG. 11(*a*).

The average code lengths of the above 2 patterns are expressed as follows:

$$l_{case1} = p(1) + 3 \cdot (p(2) + p(3) + p(4) + p(5))$$

$$l_{case2} = 2 \cdot (p(1) + p(2) + p(3)) + 3 \cdot (p(4) + p(5)) \tag{14}$$

Similar to the preceding example, the range of the value of p(1) that makes $l_{case1} = l_{case2}$ possible is considered and, as a result, ⅓≦p(1)≦⅜ is obtained.

Figures 11A, 11B, 11C, 11D:
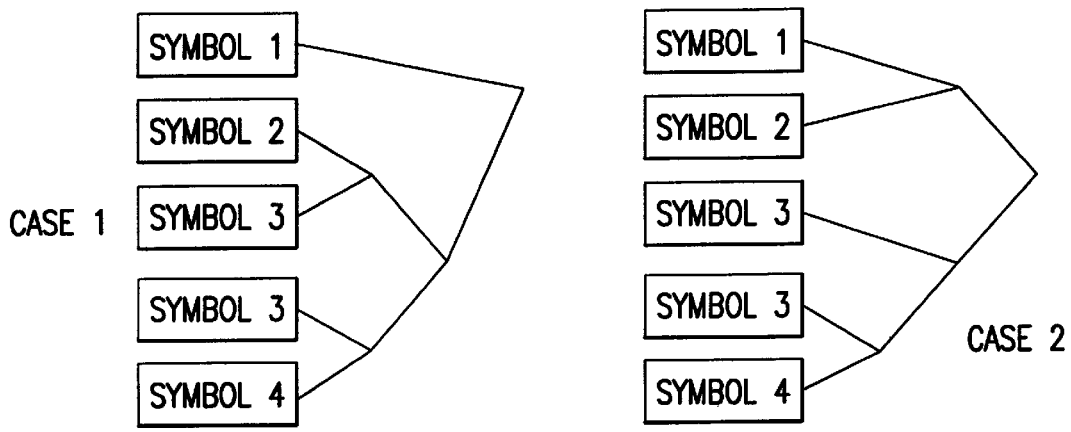
FIGS. 11(a) through 11(d) show examples of codes generated in the second embodiment of the coding-decoding apparatus according to the present invention.

FIG. 11(*d*) shows the upper and lower limits of each of the average code lengths $l_{case1}$ and $l_{case2}$. As shown in FIG. 11(*d*), it turns out that the bit assignment of case2 is optimum when the value of p(1) is ⅓ or less and that the bit assignment of case1 is optimum when the value of p(1) is ⅜ or more. Accordingly, $p_{th}$ used in step 2072 in FIG. 10 is selected from within the range of ⅓ to ⅜ or the vicinity thereof. Similar to the case of the four dominant symbols, it is possible to obtain an optimum code by calculating the expression $l_{case2} - l_{case1} = p(1) - p(2) - p(3)$ and confirming whether it is plus or minus.

According to the second embodiment, the process of the Huffman coding can be performed by classifying the bit assignment into patterns prepared in advance. Moreover, the classification can be performed by carrying out the processes of sorting and comparing the dominant symbols. Therefore, the second embodiment can greatly simplify the operation of the first embodiment.

Figures 12, 13:
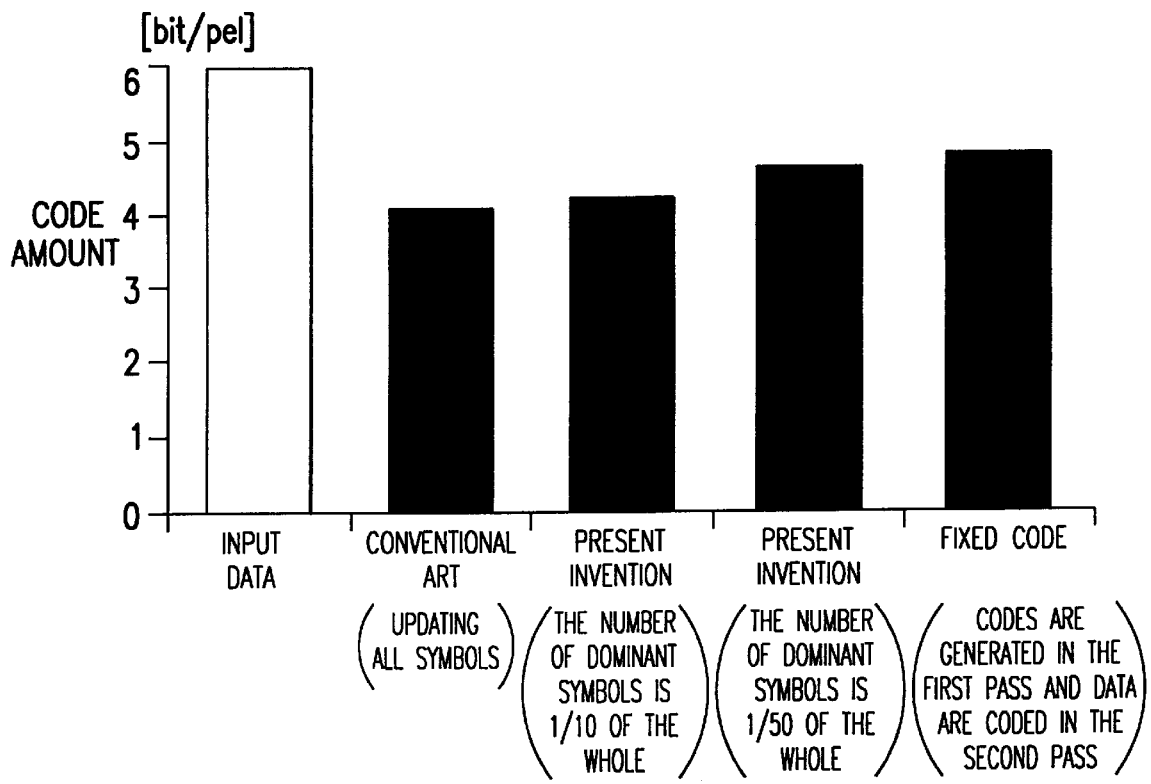
FIG. 12 shows an example of the result of experiment by the second embodiment of the coding-decoding apparatus according to the present invention.
FIG. 13 shows an example of the conventional Huffman code.

An example of the results of the present invention is shown in FIG. 12. In the example, 6-bit data is input and coded by the following four methods:

1) a prior art method;
2) the present invention wherein the number of dominant symbols is ¹⁄₁₀ of the whole;
3) the present invention wherein the number of dominant symbols is ¹⁄₅₀ of the whole; and 4) general Huffman code (codes are generated based on the statistics of symbols in the first pass and data are coded in the second pass).

As a result of the above example, it was determined that the processing times of methods 2), 3) and 4) are almost the same and were between 1/20 and 1/50 of the processing time of method 1). The effect of the present invention can be seen from FIG. 12.

According to the present invention, adaptive Huffman coding can be easily accomplished without requiring large memory capacity or creating a heavy processing load.

Third Embodiment

As a third embodiment, a coding-decoding apparatus which integrates a coding function and decoding function for simplifying implementation of the coding apparatus and decoding apparatus of the present invention will be discussed. The third embodiment realizes a simple construction by utilizing elements having the same functions common to the coding and decoding apparatuses.

Figure 14:
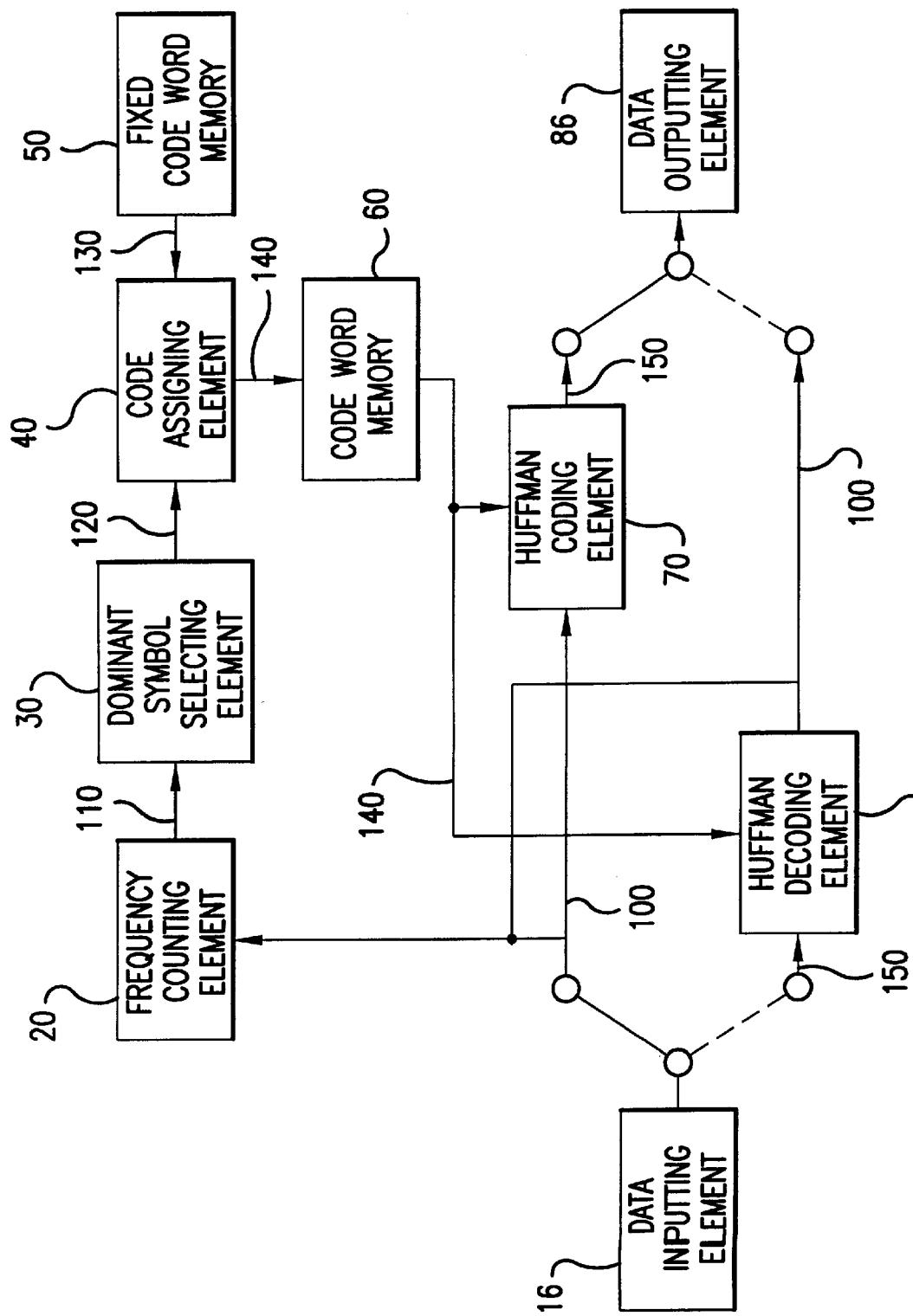
FIG. 14 shows the construction of the third embodiment of a coding-decoding apparatus according to the present invention.
Figure 15:
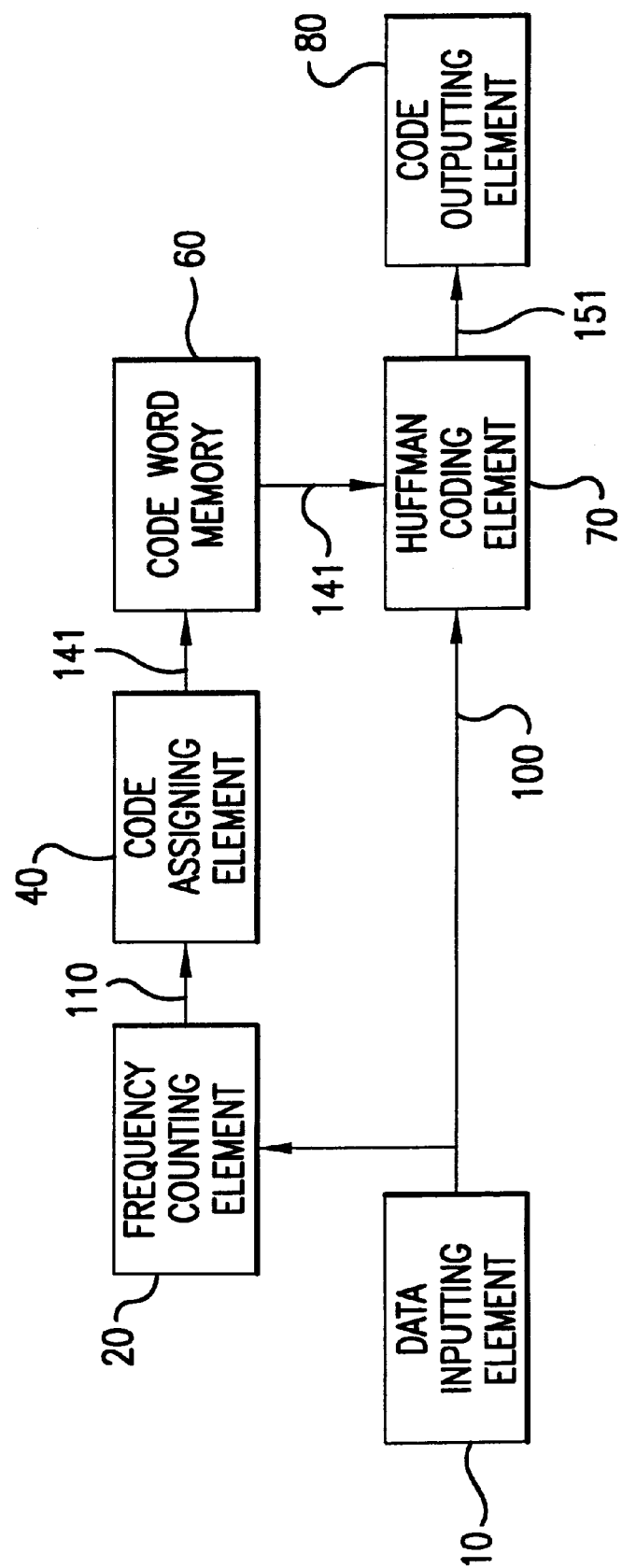
FIG. 15 shows the construction of a coding apparatus according to a prior art apparatus.
Figure 16:
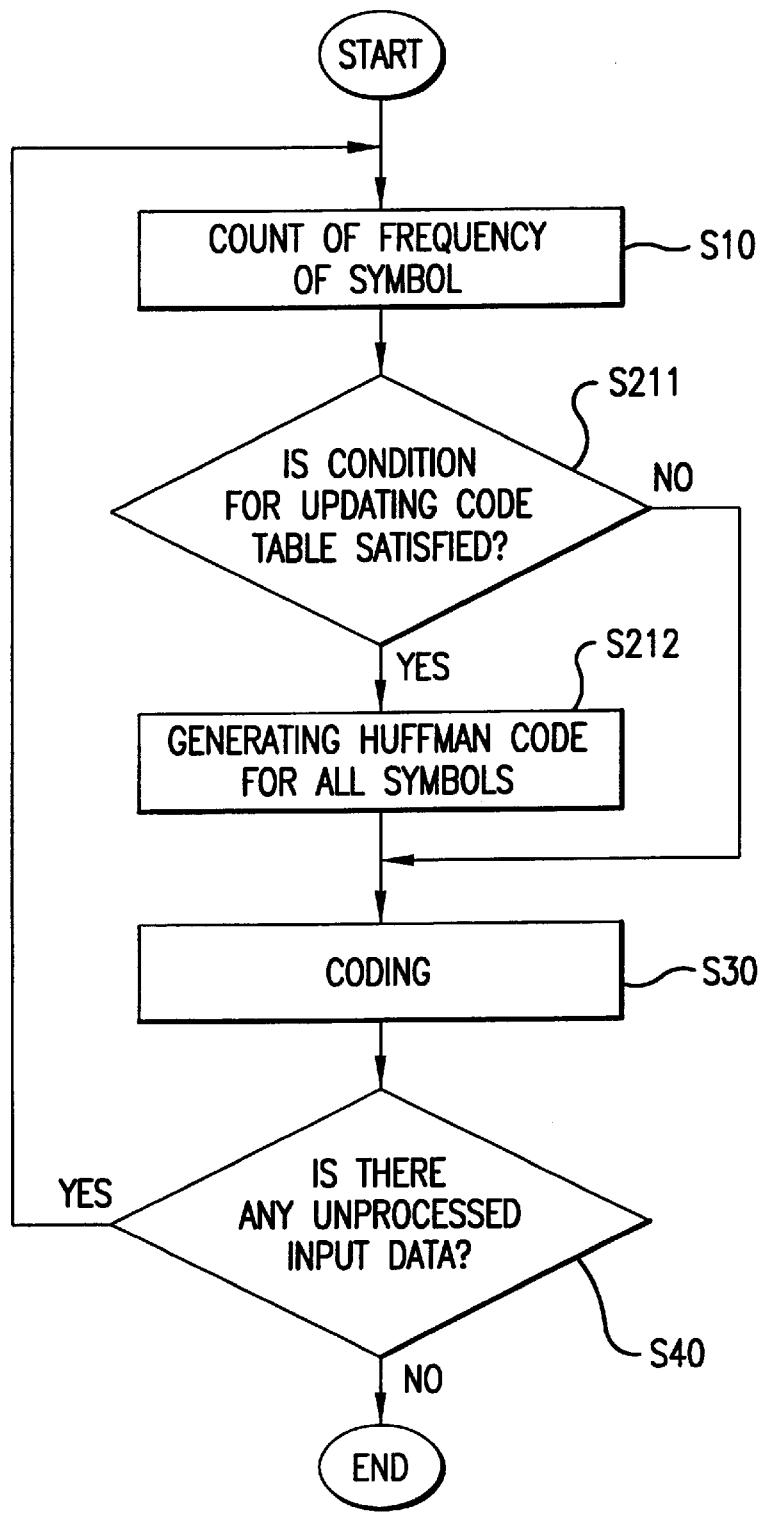
FIG. 16 is a flow chart showing an example of a coding operation in the coding apparatus of FIG. 15.
Figure 17:
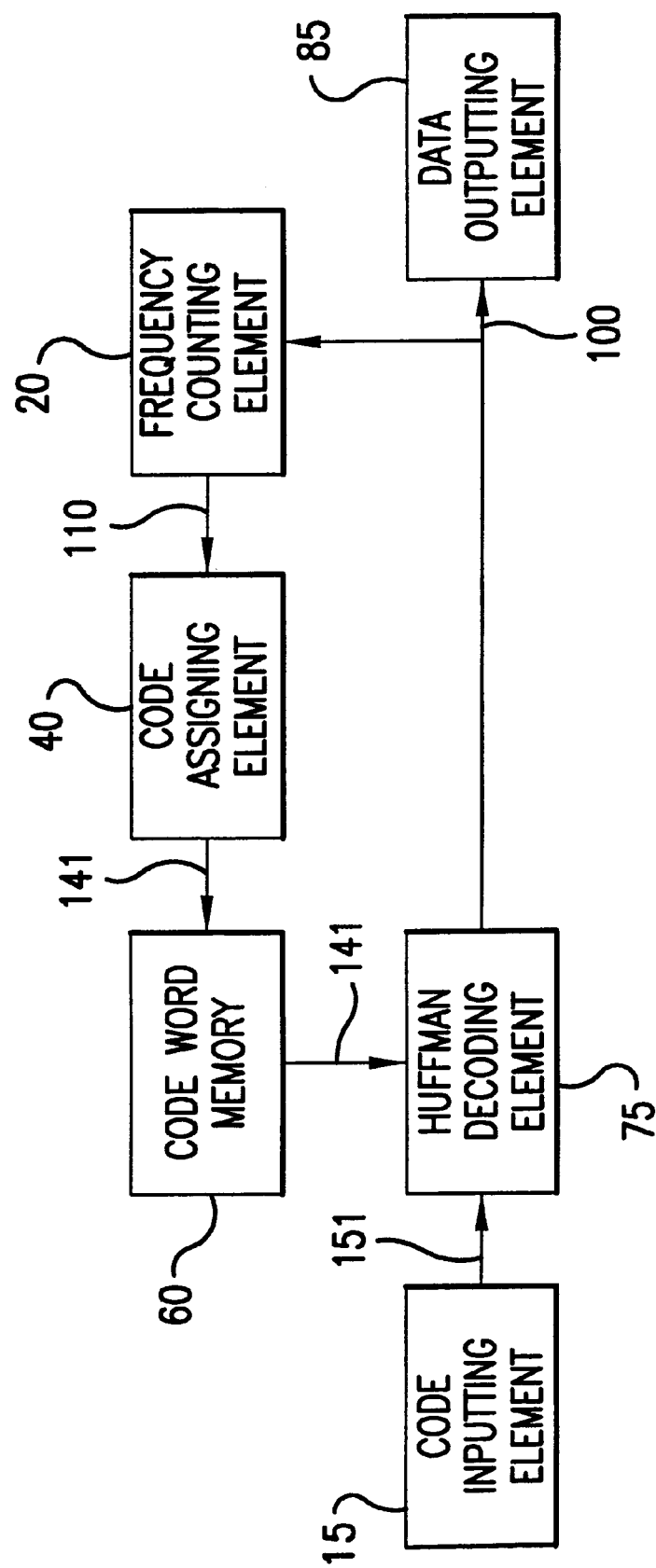
FIG. 17 shows the construction of a decoding apparatus according to a prior art apparatus.
Figure 18:
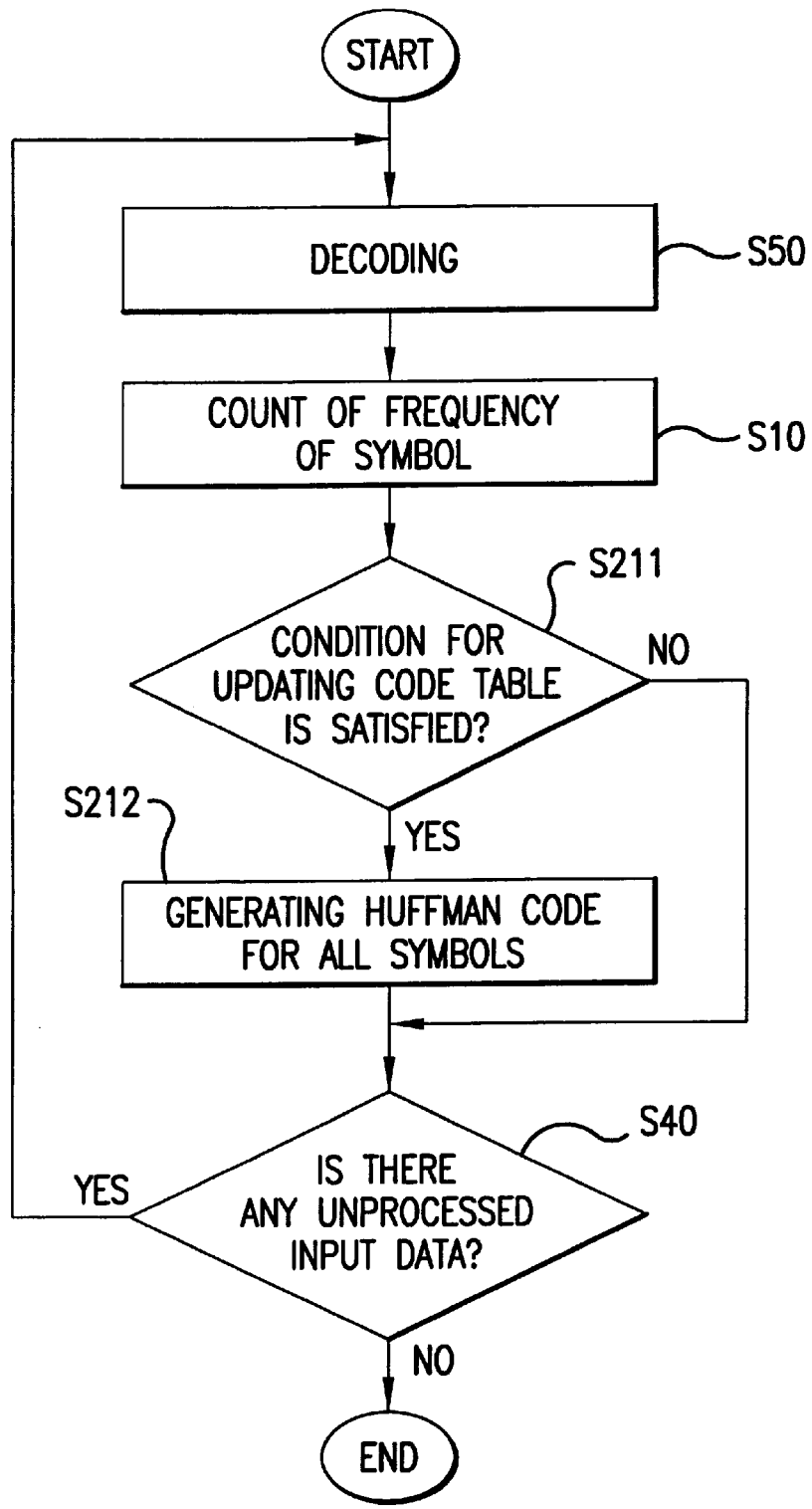
FIG. 18 is a flow chart showing an example of a decoding operation in the decoding apparatus of FIG. 17.

FIG. 14 is a block diagram showing the construction of the coding-decoding apparatus of the third embodiment. Corresponding elements in FIGS. 1, 4 and 14 have the same reference numbers and their explanations are omitted. In FIG. 14, reference numerals 16 and 86 indicate a data inputting element and data outputting element, respectively.

As described above, the third embodiment is characterized in that a single apparatus has a coding function and decoding function. When the coding process is executed, input data 100 is input by the data inputting element 16, transmitted through the Huffman coding element 70 and output by the data outputting element 80 as coded data 150. A series of operations of this case is the same as that of the coding process in the first and second embodiments. In the decoding process, the coded data 150 is input by the data inputting element 16, transmitted through the Huffman decoding element 75 and output by the data outputting element. A series of operations in this case is the same as that of the decoding process in the first and second embodiments.

The third embodiment can integrate main functions common to the coding apparatus and decoding apparatus of the first and second embodiments. Therefore, the coding-decoding apparatus of the third embodiment is about half as large in size as the coding and decoding apparatuses separately provided. This embodiment is particularly advantageous for an apparatus in which data should be temporarily compressed such as a database or a disk.

What is claimed is:

1. A coding method comprising the steps of:
   inputting data containing a plurality of symbols;
   counting a frequency of appearance of each symbol in the input data;
   selecting a dominant symbol from the plurality of symbols based on the counted frequency of appearance;
   generating a code word for the selected dominant symbol;
   generating a code word according to a predicted probability of appearance for a non-dominant symbol; and
   coding the input data based on at least one of the generated code word for the selected dominant symbol and the generated code word for the non-dominant symbol.

2. The coding method as set forth in claim 1, wherein the code word is generated by preparing a plurality of patterns of the probability of appearance of the symbol and a plurality of code words respectively corresponding thereto in advance and the dominant symbol is classified into one of the plurality of patterns.

3. The coding method as set forth in claim 2, wherein the dominant symbol is classified into a pattern by comparing the probability of appearance of the symbol appearing most frequently with a threshold value.

4. The coding method as set forth in claim 2, wherein the dominant symbol is classified into a pattern according to a result of an operation using frequencies of some of the dominant symbols sorted in orders of frequency which correspond to a plurality of predetermined orders.

5. The coding method as set forth in claim 1, wherein the dominant symbol is a symbol having a frequency larger than a predetermined threshold value.

6. The coding method as set forth in claim 1, wherein the dominant symbol selected from the symbols sorted in descending order of frequency of appearance based on the result of the count of the frequency is a symbol having a higher rank than a predetermined rank value.

7. The coding method as set forth in claim 1, wherein the symbols are sorted in descending order of frequency of appearance, and the dominant symbol is a symbol selected from the sorted symbols having a value of accumulated frequencies of preceding symbols smaller than a predetermined threshold value.

8. The coding method as set forth in claim 1, wherein the code word for the selected dominant symbol is generated by using the Huffman coding method.

9. The coding method as set forth in claim 1, wherein the code word is generated when the frequency of appearance of each symbol is larger than a predetermined value.

10. The coding method as set forth in claim 1, wherein the code word is generated when coding of a predetermined number of symbols is completed.

11. The coding method as set forth in claim 1, wherein the frequency is a statistical value that is initialized by multiplying the statistical value at that time by a positive number not more than 1.

12. The coding method as set forth in claim 1, wherein the code word is replaced with a new code word generated based on a statistical value of processed data.

13. The coding method as set forth in claim 1, wherein a constant is set as an initial value for a code word.

14. A decoding method comprising the steps of:
   inputting coded data; and
   generating decoded data having a plurality of symbols by using generated code words, the generated code words being generated by:
      counting a frequency of appearance of each of symbols in previously decoded data;
      selecting a dominant symbol from the symbols based on the counted frequencies of appearance;
      generating a code word for the dominant symbol; and
      generating a code word according to a predicted probability of appearance for a non-dominant symbol.

15. The decoding method as set forth in claim 14, wherein the code word is generated by preparing a plurality of patterns of the probability of appearance of the symbol and a plurality of code words respectively corresponding thereto in advance and the dominant symbol is classified into one of the plurality of patterns.

16. The decoding method as set forth in claim 15, wherein the dominant symbol is classified into a pattern by comparing the probability of appearance of the symbol appearing most frequently with a threshold value.

17. The decoding method as set forth in claim 15, wherein the dominant symbol is classified into a pattern according to a result of an operation using frequencies of some of the dominant symbols sorted in orders of frequency which correspond to a plurality of predetermined orders.

18. The decoding method as set forth in claim 14, wherein the dominant symbol is a symbol having a frequency larger than a predetermined threshold value.

19. The decoding method as set forth in claim 14, wherein the dominant symbol selected from the symbols sorted in descending order of frequency of appearance based on the result of the count of the frequency is a symbol having a higher rank than a predetermined rank value.

20. The decoding method as set forth in claim 14, wherein symbols are sorted in descending order of frequency of appearance and the dominant symbol is a symbol selected from the sorted symbols having a value of accumulated frequencies of preceding symbols smaller than a predetermined threshold value.

21. The decoding method as set forth in claim 14, wherein the code word for the selected dominant symbol is generated by using the Huffman coding method.

22. The decoding method as set forth in claim 14, wherein the code word is generated when the frequency of appearance of each symbol is larger than a predetermined value.

23. The decoding method as set forth in claim 14, wherein the code word is generated when decoding of a predetermined number of symbols is completed.

24. The decoding method as set forth in claim 14, wherein the frequency is a statistical value that is initialized by multiplying the statistical value at that time by a positive number not more than 1.

25. The decoding method as set forth in claim 14, wherein the code word is replaced with a new code word generated based on a statistical value of processed data.

26. The decoding method as set forth in claim 14, wherein a constant is set as an initial value for a code word.

27. A coding apparatus comprising:
   a data inputting element that inputs data containing a plurality of symbols to be coded;
   a frequency counting element that counts a frequency of appearance of each symbol in the data input through the data inputting element;
   a symbol selecting element that selects a dominant symbol from the plurality of symbols based on the frequency of appearance counted by the frequency counting element;
   a fixed code word storing element that stores a fixed code word corresponding to each symbol, the fixed code word being predetermined according to a predicted probability of appearance of the corresponding symbol;
   a code assigning element that generates a new code word for the dominant symbol and generates a combined code word that is a combination of a code word indicating a non-dominant symbol and a fixed code word stored in the fixed code word storing element, for a non-dominant symbol;
   a code word storing element that stores the new code word and the combined code word generated by the code assigning element;
   a coding element that encodes the data input through the data inputting element in accordance with the code word and the combined code word stored in the code word storing element; and
   a code outputting element that outputs coded data generated by the coding element.

28. The coding apparatus as set forth in claim 27, wherein the code word is generated by preparing a plurality of patterns of the probability of appearance of the symbol and a plurality of code words respectively corresponding thereto in advance and the dominant symbol is classified into one of the plurality of patterns by the code assigning element.

29. The coding apparatus as set forth in claim 28, wherein the dominant symbol is classified into a pattern by comparing the probability of appearance of the symbol appearing most frequently with a threshold value.

30. The coding apparatus as set forth in claim 28, wherein the dominant symbol is classified into a pattern according to a result of an operation using frequencies of some of the dominant symbols sorted in orders of frequency which correspond to a plurality of predetermined orders.

31. The coding apparatus as set forth in claim 27, wherein the dominant symbol is a symbol having a frequency larger than a predetermined threshold value.

32. The coding apparatus as set forth in claim 27, wherein the dominant symbol selected from the symbols sorted in descending order of frequency of appearance by the symbol selecting element based on the result of the count of the frequency by the frequency counting element is a symbol having a higher rank than a predetermined rank value.

33. The coding apparatus as set forth in claim 27, wherein symbols are sorted in descending order of frequency of appearance, and the dominant symbol is a symbol selected from the sorted symbols having a value of accumulated frequencies of preceding symbols smaller than a predetermined threshold value.

34. The coding apparatus as set forth in claim 27, wherein the code assigning element generates a new code word for the dominant symbol by using the Huffman coding method.

35. The coding apparatus as set forth in claim 27, wherein when there is an extra fixed code word which should have been assigned to the dominant symbol and there is a non-dominant symbol having a code with its length longer than that of the fixed code word, the fixed code word is temporarily assigned to the non-dominant symbol.

36. The coding apparatus as set forth in claim 27, wherein the code assigning element is activated when the frequency of appearance of each symbol is larger than a predetermined value.

37. The coding apparatus as set forth in claim 27, wherein the code assigning element is activated when coding of a predetermined number of symbols is completed.

38. The coding apparatus as set forth in claim 27, wherein, when it is predicted that an average code word length of the new code word and the combined code word generated in the code assigning element is longer than the average code word length of the fixed code word stored in the fixed code word storing element, the fixed code word is assigned as a new code word.

39. The coding apparatus as set forth in claim 27, wherein the frequency is a statistical value that is initialized in the frequency counting element by multiplying the statistical value at that time by a positive number not more than 1.

40. The coding apparatus as set forth in claim 27, wherein the code word to be stored in the fixed code word storing element is replaced with a new code word generated based on a statistical value of processed data.

41. The coding apparatus as set forth in claim 27, wherein a constant is set as an initial value for a code word in the code word storing element.

42. The coding apparatus as set forth in claim 27, wherein the fixed code word stored in the fixed code word storing element is used as a code word as an initial value in the code word storing element.

43. A coding apparatus comprising:
   data inputting means for inputting data containing a plurality of symbols to be coded;
   frequency counting means for counting a frequency of appearance of each symbol in the data input through the data inputting means;
   symbol selecting means for selecting a dominant symbol from the plurality of symbols based on the frequency of appearance counted by the frequency counting means;

fixed code word storing means for storing a fixed code word corresponding to each symbol, the fixed code word being predetermined according to a predicted probability of appearance of the corresponding symbol;

code assigning means for generating a new code word for the dominant symbol and generating a combined code word that is a combination of a code word indicating a non-dominant symbol and a fixed code word stored in the fixed code word storing means, for a non-dominant symbol;

code word storing means for storing the new code word and the combined code word generated by the code assigning means;

coding means for coding the data input through the data inputting means in accordance with the code word and the combined code word stored in the code word storing means; and code outputting means for outputting coded data generated by the coding means.

44. A decoding apparatus comprising:

a code inputting element that inputs code data;

a code word storing element that stores a code word;

a decoding element that generates decoded data by decoding the code data input through the code inputting element in accordance with the code word stored in the code word storing element, wherein the decoded data includes a plurality of symbols;

a frequency counting element that counts a frequency of appearance of each of the symbols contained in the decoded data;

a symbol selecting element that selects a dominant symbol from the symbols in the decoded data based on the frequencies of appearance counted by the frequency counting element;

a fixed code word storing element that stores a fixed code word corresponding to each symbol, the fixed code word being predetermined according to a predicted probability of appearance of the corresponding symbol;

a code assigning element that generates a new code word for the dominant symbol and generates a combined code word that is a combination of a code word indicating a non-dominant symbol and a fixed code word stored in the fixed code word storing element, for a non-dominant symbol; and a data outputting element that stores the new code word and the combined code word generated by the code assigning element in the code word storing element and outputting the decoded data.

45. The decoding apparatus as set forth in claim 44, wherein the code word is generated by preparing a plurality of patterns of the probability of appearance of the symbol and a plurality of code words respectively corresponding thereto in advance and the dominant symbol is classified into one of the plurality of patterns by the code assigning element.

46. The decoding apparatus as set forth in claim 45, wherein the dominant symbol is classified into a pattern by comparing the probability of appearance of the symbol appearing most frequently with a threshold value.

47. The decoding apparatus as set forth in claim 45, wherein the dominant symbol is classified into a pattern according to a result of an operation using frequencies of some of the dominant symbols sorted in orders of frequency which correspond to a plurality of predetermined orders.

48. The decoding apparatus as set forth in claim 44, wherein the dominant symbol is a symbol having a frequency larger than a predetermined threshold value.

49. The decoding apparatus as set forth in claim 44, wherein the dominant symbol selected from the symbols sorted in descending order of frequency of appearance by the symbol selecting element based on the result of the count of the frequency by the frequency counting element is a symbol having a higher rank than a predetermined rank value.

50. The decoding apparatus as set forth in claim 44, wherein the symbols are sorted in descending order of frequency of appearance and the dominant symbol is a symbol selected from the sorted symbols having a value of accumulated frequencies of preceding symbols smaller than a predetermined threshold value.

51. The decoding apparatus as set forth in claim 44, wherein the code assigning element generates a new code word for the dominant symbol using the Huffman coding method.

52. The decoding apparatus as set forth in claim 44, wherein when there is an extra fixed code word which should have been assigned to the dominant symbol and there is a non-dominant symbol having a code with its length longer than that of the fixed code word, the fixed code word is temporarily assigned to the non-dominant symbol.

53. The decoding apparatus as set forth in claim 44, wherein the code assigning element is activated if the frequency of appearance of each symbol is larger than a predetermined value.

54. The decoding apparatus as set forth in claim 44, wherein the code assigning element is activated when decoding of a predetermined number of symbols is completed.

55. The decoding apparatus as set forth in claim 44, wherein, when it is predicted that an average code word length of the new code word and the combined code word generated in the code assigning element is longer than the average code word length of the fixed code word stored in the fixed code word storing element, the fixed code word is assigned as a new code word.

56. The decoding apparatus as set forth in claim 44, wherein the frequency is a statistical value that is initialized by multiplying the statistical value at that time by a positive number not more than 1.

57. The decoding apparatus as set forth in claim 44, wherein the code word to be stored in the fixed code word storing element is replaced with a new code word generated based on a statistical value of processed data.

58. The decoding apparatus as set forth in claim 44, wherein a constant is set as an initial value for a code word in the code word storing element.

59. The decoding apparatus as set forth in claim 44, wherein the fixed code word stored in the fixed code word storing element is used as an initial value for a code word in the code word storing element.

60. A decoding apparatus comprising:

code inputting means for inputting code data;

code word storing means for storing a code word;

decoding means for generating decoded data by decoding the code data input through the code inputting means in accordance with the code word stored in the code word storing means, wherein the decoded data includes a plurality of symbols;

frequency counting means for counting a frequency of appearance of each of the symbols contained in the decoded data;

symbol selecting means for selecting a dominant symbol from the symbols in the decoded data based on the frequencies of appearance counted by the frequency counting means;

fixed code word storing means for storing a fixed code word corresponding to each symbol, the fixed code word being predetermined according to a predicted probability of appearance of the corresponding symbol;

code assigning means for generating a new code word for the dominant symbol and generating a combined code word that is a combination of a code word indicating a non-dominant symbol and a fixed code word stored in the fixed code word storing means, for a non-dominant symbol; and data outputting means for storing the new code word and the combined code word generated by the code assigning means in the code word storing means and outputting the decoded data.

61. A coding-decoding apparatus comprising:

a data inputting element that inputs data, the data being one of data to be coded containing a plurality of symbols and coded data;

a decoding element that generates decoded data when the input data is coded data, the decoded data including a plurality of symbols;

a frequency counting element that counts a frequency of appearance of each symbol in either the data to be coded or the decoded data, depending on input data;

a symbol selecting element that selects a dominant symbol from the plurality of symbols in either the data to be coded or the decoded data, depending on the input data, based on the frequency of appearance counted by the frequency counting element;

a fixed code word storing element that stores a fixed code word corresponding to each symbol, the fixed code word being predetermined according to a predicted probability of appearance of the corresponding symbol;

a code assigning element that generates a new code word for the dominant symbol and generates a combined code word that is a combination of a code word indicating a non-dominant symbol and a fixed code word storing element, for a non-dominant symbol;

a code word storing element that stores the new code word and the combined code word generated by the code assigning element;

a coding element that encodes the data input, when the input data is data to be coded, in accordance with the new code word and the combined code word stored in the code word storing element; and a data outputting element that outputs either the coded data or the decoded data depending on input data.

62. A coding-decoding apparatus comprising:

data inputting means for inputting data, the data being one of data to be coded containing a plurality of symbols and coded data;

decoding means for generating decoded data when the input data is coded data, the decoded data including a plurality of symbols;

frequency counting means for counting a frequency of appearance of each symbol in either the data to be coded or the decoded data, depending on input data;

symbol selecting means for selecting a dominant symbol from the plurality of symbols in either the data to be coded or the decoded data, depending on the input data, based on the frequency of appearance counted by the frequency counting means;

fixed code word storing means for storing a fixed code word corresponding to each symbol, the fixed code word being predetermined according to a predicted probability of appearance of the corresponding symbol;

code assigning means for generating a new code word for the dominant symbol and generating a combined code word that is a combination of a code word indicating a non-dominant symbol and a fixed code word storing means, for a non-dominant symbol;

code word storing means for storing the new code word and the combined code word generated by the code assigning means;

coding means for coding the data input, when the input data is data to be coded, in accordance with the new code word and the combined code word stored in the code word storing means; and data outputting means for outputting either the coded data or the decoded data depending on input data.

* * * * *